US008354892B2

(12) United States Patent
Jeong et al.

(10) Patent No.: US 8,354,892 B2
(45) Date of Patent: Jan. 15, 2013

(54) MARCHAND BALUN DEVICE FOR FORMING PARALLEL AND VERTICAL CAPACITANCE

(75) Inventors: Jin Cheol Jeong, Daejeon (KR); In Bok Yom, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 370 days.

(21) Appl. No.: 12/832,360

(22) Filed: Jul. 8, 2010

(65) Prior Publication Data

US 2011/0102096 A1 May 5, 2011

(30) Foreign Application Priority Data

Nov. 3, 2009 (KR) ........................ 10-2009-0105577
Apr. 14, 2010 (KR) ........................ 10-2010-0034266

(51) Int. Cl.
*H03H 7/42* (2006.01)
*H01P 3/08* (2006.01)

(52) U.S. Cl. .......................................... 333/26; 333/238

(58) Field of Classification Search .................... 333/25, 333/26, 238
See application file for complete search history.

(56) References Cited

U.S. PATENT DOCUMENTS

| | | | | |
|---|---|---|---|---|
| 4,755,775 | A * | 7/1988 | Marczewski et al. | 333/26 |
| 5,025,232 | A * | 6/1991 | Pavio | 333/26 |
| 5,243,305 | A | 9/1993 | D'Oro et al. | |
| 6,150,897 | A | 11/2000 | Nishikawa et al. | |
| 7,157,986 | B1 * | 1/2007 | Wu et al. | 333/26 |
| 7,215,218 | B2 | 5/2007 | Burns et al. | |
| 7,274,267 | B2 * | 9/2007 | Saitou et al. | 333/26 |
| 7,471,167 | B2 * | 12/2008 | Kim et al. | 333/26 |
| 8,154,360 | B2 * | 4/2012 | Uemichi et al. | 333/26 |
| 2008/0070519 | A1 | 3/2008 | Okabe | |

FOREIGN PATENT DOCUMENTS

| | | | |
|---|---|---|---|
| JP | 2001-185919 | A | 7/2001 |
| JP | 2002-359507 | A | 12/2002 |
| JP | 2004-274172 | A | 9/2004 |
| JP | 2006-121313 | A | 5/2006 |
| JP | 2006-333290 | A | 12/2006 |
| JP | 2008-060915 | A | 3/2008 |
| JP | 2008-078853 | A | 4/2008 |
| KR | 10-0770134 | B1 | 10/2007 |

OTHER PUBLICATIONS

Chin-Shen Lin, et al., "Analysis of Multiconductor Coupled-Line Marchand Baluns for Miniature MMIC Design", IEEE Trans. Microwave Theory Tech., 2007, vol. 55, No. 6, pp. 1190-1199.

Kenjiro Nishikawa, et al., "Compact and Broad-Band Three-Dimensional MMIC Balun", IEEE Trans. Microwave Theory Tech., 1999, vol. 47, No. 1, pp. 96-98.

* cited by examiner

*Primary Examiner* — Dean O Takaoka
(74) *Attorney, Agent, or Firm* — Rabin & Berdo, P.C.

(57) ABSTRACT

Provided is a marchand balun device. The marchand balun device includes: a first line connected between a balanced terminal and a ground terminal; a second line disposed horizontally parallel to the first line and forming a parallel capacitance jointly with the first line; and a coupled line disposed vertically parallel to the first and second lines and forming a vertical capacitance jointly with one of the first and second lines.

10 Claims, 8 Drawing Sheets

MARCHAND BALUN DEVICE FOR FORMING PARALLEL AND VERTICAL CAPACITANCE

CROSS-REFERENCE TO RELATED APPLICATIONS

This U.S. non-provisional patent application claims priority under 35 U.S.C. §119 of Korean Patent Application Nos. 10-2009-0105577, filed on Nov. 3, 2009, and 10-2010-0034266, filed on Apr. 14, 2010, the entire contents of which are hereby incorporated by reference.

BACKGROUND OF THE INVENTION

The present invention disclosed herein relates to a balun device, and more particularly, to a marchand balun device having broadband properties.

A balun device is typically used for designing a balanced mixer, a 2-multiplier, a push-pull amplifier. Since the balanced mixer has an excellent ability for harmonic rejections and has a broad dynamic range, it is used for various kinds of Radio Frequency (RF) systems. The balanced mixer needs two signals having the same amplitude but respectively different phases. Those signals are generated by the balun device.

A typical balun device has been mainly designed using a passive device. A representative balun device includes a Lange coupler, a Rat race coupler, and a Directional coupler. Frequency bands of these couplers are known as about 10% to about 15% of a start frequency.

In order to realize a broadband balun device, a Marchand balun is being developed which consists of two coupled lines of ¼ wavelength. The loads of the marchand balun device are at the middle portion of a coupled line of which two ends are grounded. A frequency band of the marchand balun device is known as up to a frequency (i.e., 1 octave) that is two times the maximum start frequency.

If a frequency band of a balun device is broad, a frequency band of a balanced mixer using the balun device is increased also. The balanced mixer for supporting a broadband may be extensively used in a system of various frequency bands. Accordingly, a market value of the balanced mixer may become significant.

The papers related to increasing a frequency band of a balun device are published by Chin-Shen Lin et. al., titled “Analysis of Multiconductor Coupled-Line Marchand Baluns for Miniature MMIC design.” in IEEE Tans. Microwave Theory Tech., Vol. 55, no. 6, pp. 1190-1199, June 2007 and by Kenjiro Nishikawa et. al., titled “Compact and Broad-Band Three-Dimensional MMIC Balun,” in IEEE Trans. Microwave Theory Tech., vol. 47, no. 1, pp. 96-98, January 1999.

Lin connects 7 coupled lines horizontally in order to increase a coupling coefficient. As a result, a broadband balun device is realized with about 30 GHz to about 60 GHz (two times a frequency band). This balun device has an output phase imbalance of about 180°±15° and an amplitude imbalance of about ±1.5 dB. Nishikawa disposes two coupled lines vertically and uses inductor compensation to obtain an output phase imbalance of about 180°±10° and an amplitude imbalance of ±1.0 dB within a range of about 8.5 GHz to about 30 GHz (3.5 times a frequency band).

The published patent, U.S. Pat. No. 6,150,897, titled “Balun Circuit with Cancellation Element in Each Coupled Line” suggests a device for compensating a balun device for property deterioration by inserting an inductor or a capacitor in a middle portion of an output unit and a coupled line of a typical marchand balun device. This patent uses a lumped element in order to compensate for property deterioration of a balun device. However, this patent does not increase a coupling coefficient of the coupled line.

SUMMARY OF THE INVENTION

The present invention provides a marchand balun device with an excellent frequency band property that is obtained by increasing a coupling coefficient.

Embodiments of the present invention provide marchand balun devices including: a first line connected between a balanced terminal and a ground terminal; a second line disposed horizontally parallel to the first line and forming a parallel capacitance jointly with the first line; and a coupled line disposed vertically parallel to the first and second lines and forming a vertical capacitance jointly with one of the first and second lines.

In some embodiments, the second line may be connected between an unbalanced terminal and an open terminal.

In other embodiments, the coupled line may be connected to one of the first and second lines through a via.

In other embodiments of the present invention, marchand balun devices include: a first line connected between a first balanced terminal and a ground terminal; a second line connected between a second balanced terminal and a ground terminal; a third line disposed horizontally parallel to the first and second lines and forming a parallel capacitance jointly with the first and second lines; a first coupled line disposed vertically parallel to the first and third lines and forming a vertical capacitance jointly with the first line or the third line; and a second coupled line disposed vertically parallel to the second and third lines and forming a vertical capacitance jointly with the second line or the third line.

In some embodiments, the third line may be connected to an unbalanced terminal and an open terminal.

In other embodiments, the third line may be disposed between the first and second lines.

In still other embodiments, each of the first and second coupled lines may be connected to the third line through a via.

In even other embodiments, the first coupled line may be connected to the first line through a via and the second coupled line may be connected to the second line through a via.

In yet other embodiments, the lengths of the first and second lines may be half of or less than that of the third line.

In further embodiments, the lengths of the first and second coupled lines may be the same as or less than those of the first and second lines.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, the present invention will now be described more fully with reference to the accompanying drawings, in which exemplary embodiments of the invention are shown. The embodiments below are provided for those skilled in the art to gain a sufficient understanding of the present invention, and various changes in form may be made but the spirit and scope of the present invention are not limited to the following embodiments.

The above-mentioned objectives, features, and advantages will be more obvious through detailed description with reference to the accompanying drawings. Accordingly, those skilled in the art may realize the technical ideas of the present invention without difficulties. Moreover, detailed descriptions related to well-known functions or configurations will be ruled out in order not to unnecessarily obscure subject matters of the present invention. Hereinafter, it will be described about an exemplary embodiment of the present invention in conjunction with the accompanying drawings.

The Radio Frequency (RF) characteristics of a marchand balun device may be enhanced by increasing a coupling coefficient between coupled lines. In order to increase the coupling coefficient of the marchand balun device, the number of coupled lines may be increased. The coupled lines may be horizontally or vertically disposed.

If the coupled lines are horizontally disposed, a size of a marchand balun device may be increased and its coupled lines may be cross-over. Due to this negative effect, an operating characteristic of the marchand balun device may be deteriorated. Moreover, since the width of the coupled line of the marchand balun is increased, it is hard to bend the coupled line, such that physical flexibility becomes deteriorated. If the coupled line is disposed vertically, the marchand balun device has limitations in realizing vertical attachments of a plurality of layers because a GaAS Monolithic Microwave Integrated Circuit (MMIC) does not provide a multilayered line of more than three stories.

In relation to a marchand balun device according to an embodiment of the present invention, in addition to a capacitance (hereinafter, referred to as a parallel capacitance) between two lines disposed in a parallel direction, a coupled line is disposed in a vertical direction in order to form a capacitance (hereinafter, referred to as a vertical capacitance) between a line and the coupled line. In such a way, coupling efficiency may be increased and operating characteristics may be improved.

Figure 1:
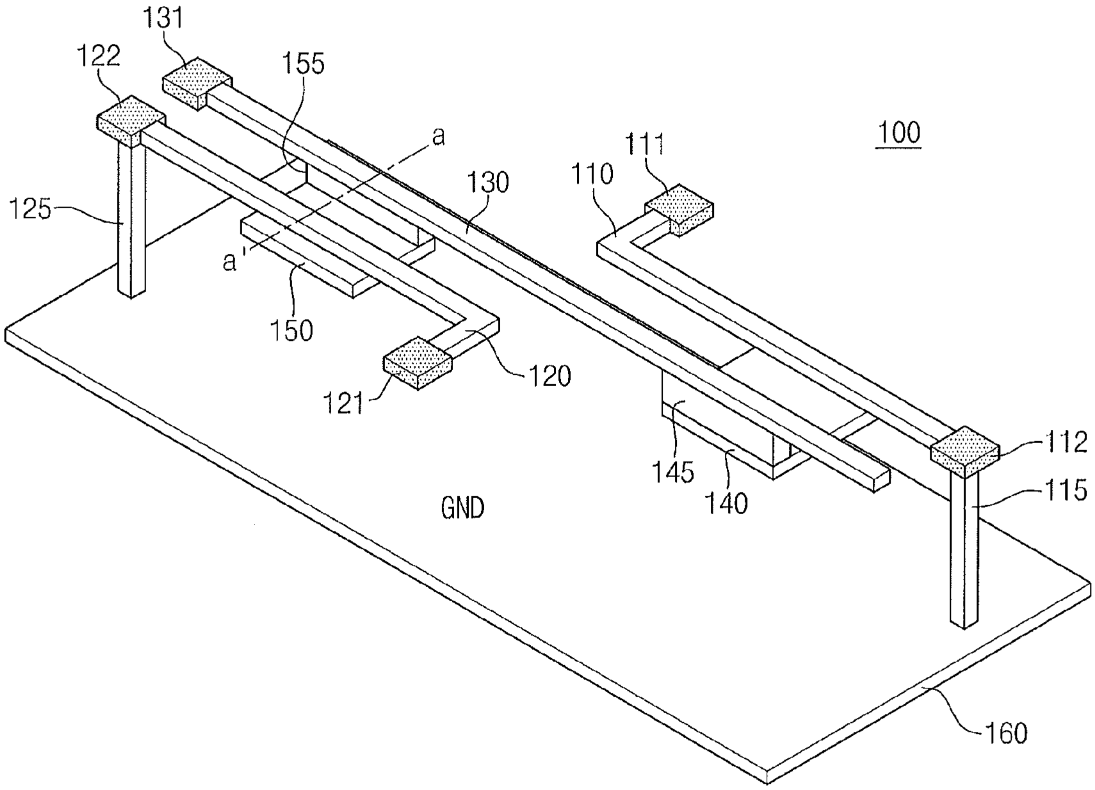
FIG. 1 is a view illustrating a marchand balun device according to a first embodiment of the present invention.

FIG. 1 is a view illustrating a marchand balun device according to a first embodiment of the present invention. Referring to FIG. 1, the marchand balun device 100 includes first to third lines 110, 120, and 130, and first and second coupled lines 140 and 150.

The first line 110 is connected between a first balanced terminal 111 and a first ground terminal 112. The first balanced terminal 111 receives a balanced signal. The first ground terminal 112 is connected to a ground layer GND and 160 through a via 115.

The second line 120 is connected to a second balanced terminal 121 and a second ground terminal 122. The second balanced terminal 121 receives a balanced signal. The second ground terminal 122 is connected to a ground layer GND and 160 through a via 125. Balanced signals of the first and second balanced terminals 111 and 121 may have the same amplitude but respectively different phases.

The third line 130 is connected to an unbalanced terminal 131. The unbalanced terminal 131 receives an unbalanced signal. One end of the third line 130 is open. Hereinafter, an open part of the third line 130 is referred to as an open terminal.

The first coupled line 140 is connected to the third line 130 through a via 145. The length of the first coupled line 140 may be same as or less than that of the first line 110. According to the length of the first coupled line 140, a vertical capacitance between the first coupled line 140 and the first line 110 may vary. The width of the first coupled line 140 may be the same as the sum of the width of the first line 110 and the width of the third line 130. The first coupled line 140 and the first line 110 form a vertical capacitance. According to the width of the first coupled line 140, a vertical capacitance between the first coupled line 140 and the first line 110 may vary.

The second coupled line 150 is connected to the third line 130 through a via 155. The length of the second coupled line 150 may be the same or less than that of the second line 120. The width of the second coupled line 150 may be the same as the sum of the width of the second line 120 and the width of the third line 130. The second coupled line 150 and the second line 120 form a vertical capacitance. Each of the first and second lines 110 and 120 may have the length of $\lambda/4$. Here, $\lambda$, is a wavelength of a balanced signal inputted into the first and second balanced terminals 111 and 121.

The marchand balun device 100 receives an unbalanced signal and outputs a balanced signal. Or, the marchand balun device 100 receives a balanced signal and outputs an unbalanced signal. It is known that the marchand balun device 100 has more excellent characteristics as odd mode impedance of a coupled line is smaller and even mode impedance is larger.

Generally, the odd mode impedance and even mode impedance with respect to a coupled line are expressed as the following [Equation 1] and [Equation 2].

$$\text{Odd mode impedance: } Zoo = Z_0\sqrt{\frac{1-c}{1+c}} \quad \text{[Equation 1]}$$

$$\text{Even mode impedance: } Zoe = Z_0\sqrt{\frac{1+c}{1-c}} \quad \text{[Equation 2]}$$

where c is a coupling coefficient

Accordingly, in order to realize the marchand balun device 100 having excellent characteristics, its coupling coefficient needs to be increased. The marchand balun device 100 adds a vertical capacitance (which is formed by a coupled line disposed in a vertical direction) besides a parallel capacitance (which is formed by lines disposed in a parallel direction) in order to increase a coupling coefficient.

Figure 2:
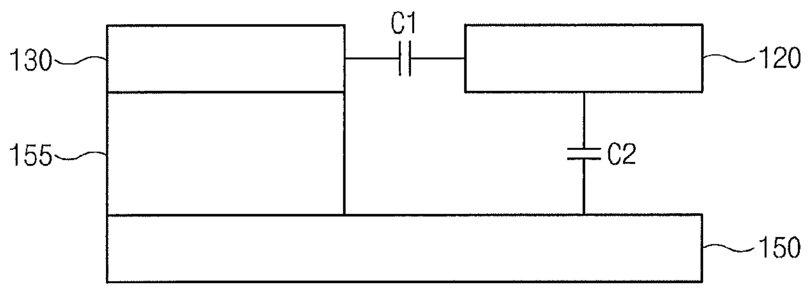
FIG. 2 is a cross-sectional view taken along the line of a-a' of the marchand balun device 100 of FIG. 1.

FIG. 2 is a cross-sectional view taken along the line of a-a' of the marchand balun device 100 of FIG. 1. Referring to FIG. 2, a parallel capacitance C1 is formed between the second and third lines 120 and 130. The third line 130 is connected to the second coupled line 150 through a via 155. The second coupled line 150 and the second line 120 form a vertical capacitance C2.

The marchand balun device 100 further adds the parallel capacitance C2 between the second coupled line 150 and the second line 120 besides the vertical capacitance C1 between the second and third lines 120 and 130, such that an overall coupling coefficient is increased.

Figure 3:
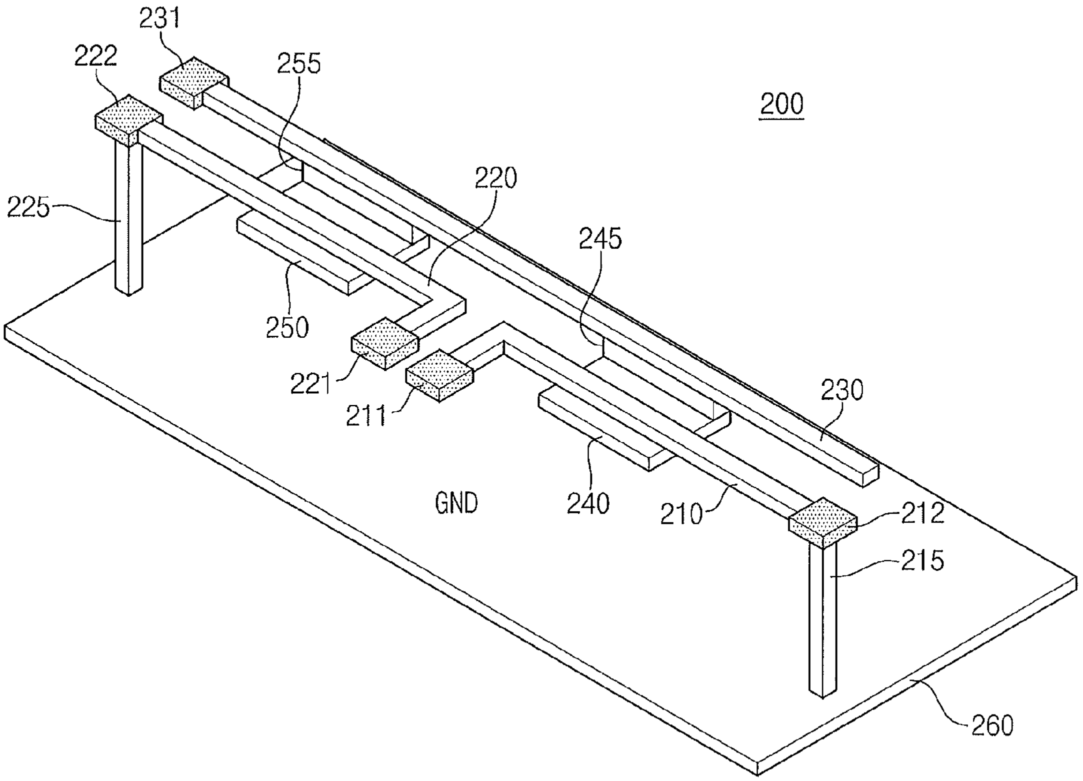
FIG. 3 is a view illustrating a marchand balun device according to a second embodiment of the present invention.

FIG. 3 is a view illustrating a marchand balun device according to a second embodiment of the present invention. Referring to FIG. 3, the marchand balun device 200 includes first to third lines 210, 220, and 230 and first and second coupled lines 240 and 250.

The first line 210 is connected between a first balanced terminal 211 and a first ground terminal 212. The first ground terminal 212 is connected to a ground layer GND and 260 through a via 215. The second line 220 is connected between a second balanced terminal 221 and a second ground terminal 222. The second ground terminal 222 is connected to a ground layer GND and 260 through a via 225. The third line 230 is connected between an unbalanced terminal 231 and an open terminal. The third line 230 is connected to the first coupled line 240 through a via 245 and is connected to the second coupled line 250 through a via 255.

The marchand balun device 200 of FIG. 3 is the same as that of FIG. 1 except that the first line 210 and the second line 220 are disposed in the same direction with respect to the third line 230. However, like the marchand balun device 100 of FIG. 1, the marchand balun device 200 of FIG. 3 adds the vertical capacitance formed by the first and second coupled lines 240 and 250 besides the parallel capacitance formed by the first to third lines 210, 220, and 230, such that an overall coupling coefficient is increased.

Figure 4:
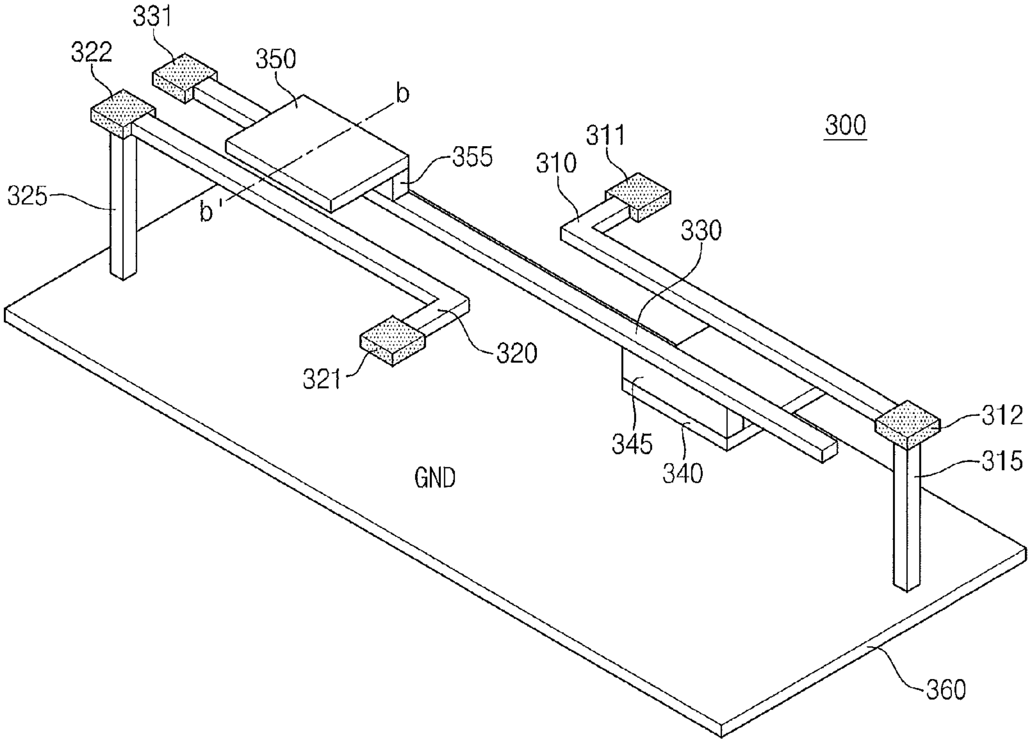
FIG. 4 is a view illustrating a marchand balun device according to a third embodiment of the present invention.

FIG. 4 is a view illustrating a marchand balun device according to a third embodiment of the present invention. Referring to FIG. 4, the marchand balun device 300 includes first to third lines 310, 320, and 330 and first and second coupled lines 340 and 350.

The first line 310 is connected between a first balanced terminal 311 and a first ground terminal 312. The first ground terminal 312 is connected to a ground layer GND and 360 through a via 315. The second line 320 is connected between a second balanced terminal 321 and a second ground terminal 322. The second ground terminal 322 is connected to a ground layer GND and 360 through a via 325. The third line 330 is connected to an unbalanced terminal 331 and an open terminal. The third line 330 is connected to the first coupled line 340 through a via 345 and is connected to the second coupled line 350 through a via 355.

The marchand balun device 300 of FIG. 4 is the same as that of FIG. 1 except that the second coupled line 350 is disposed on the second and third lines 320 and 330. However, like the marchand balun device 100 of FIG. 1, the marchand balun device 300 of FIG. 4 adds the vertical capacitance formed by the first and second coupled lines 340 and 350 besides the parallel capacitance formed by the first to third lines 310, 320, and 330, such that an overall coupling coefficient is increased.

Figure 5:
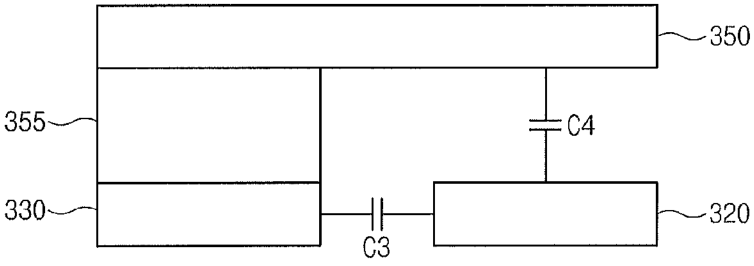
FIG. 5 is a cross-sectional view taken along the line b-b' of the marchand balun device 300 of FIG. 4.

FIG. 5 is a cross-sectional view taken along the line b-b' of the marchand balun device 300 of FIG. 4. Referring to FIG. 5, the marchand balun device 300 of FIG. 4 adds the vertical capacitance C4 between the second coupled line 350 and the second line besides the parallel capacitance C3 between the second and third lines 320 and 330, such that an overall coupling coefficient is increased.

Figure 6:
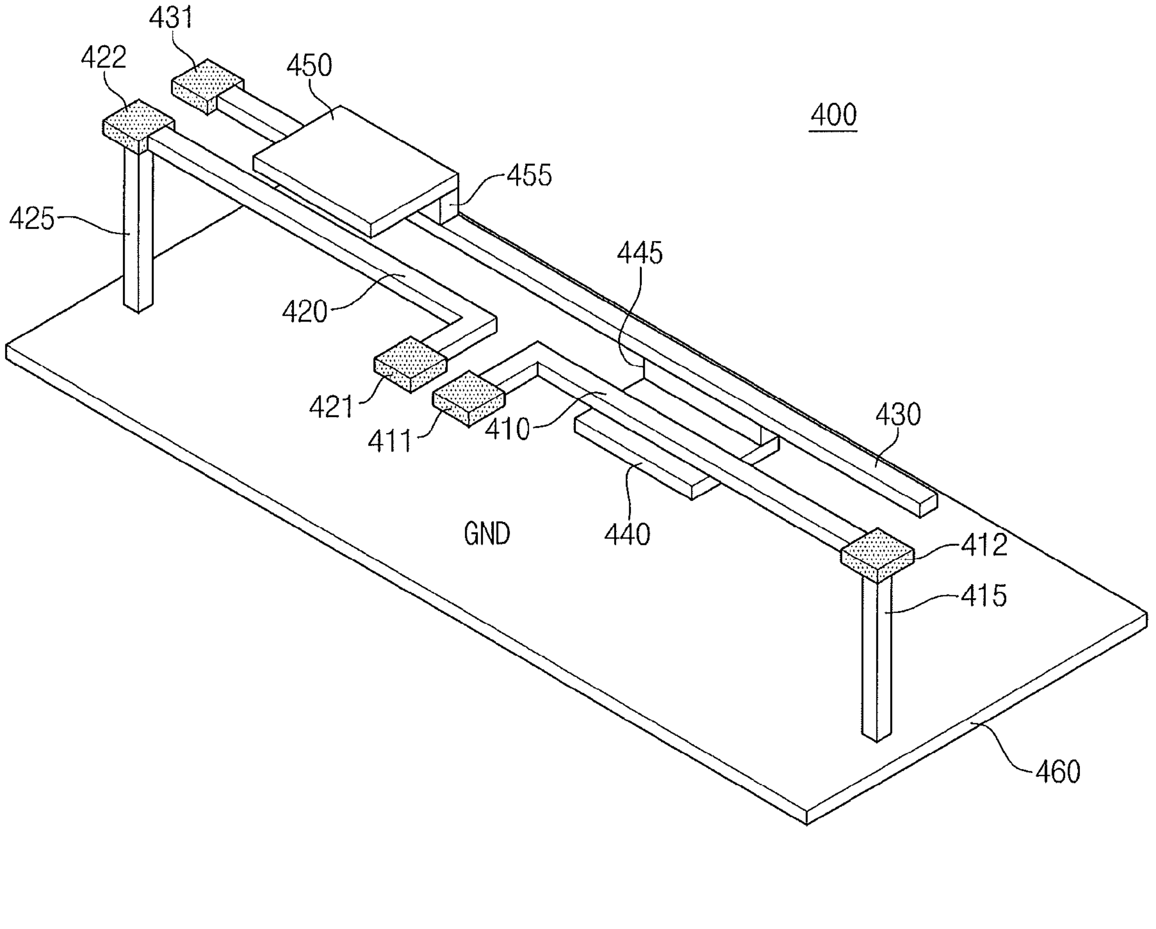
FIG. 6 is a view illustrating a marchand balun device according to a fourth embodiment of the present invention.

FIG. 6 is a view illustrating a marchand balun device according to a fourth embodiment of the present invention. The marchand balun device 400 includes first to third lines 410, 420, and 430 and first and second coupled lines 440 and 450.

The first line 410 is connected between a first balanced terminal 411 and a first ground terminal 412. The first ground terminal 412 is connected to a ground layer GND and 460 through a via 415. The second line 420 is connected between a second balanced terminal 421 and a second ground terminal 422. The second ground terminal 422 is connected to the ground layer GND and 460 through a via 425. The third line 430 is connected to the first coupled line 440 through a via 445 and is connected to the second coupled line 450 through a via 455.

The marchand balun device 400 of FIG. 6 is the same as that of FIG. 4 except that the first line 410 and the second line 420 are disposed in the same direction with respect to the third line 430. However, like the marchand balun device 300 of FIG. 4, the marchand balun device 400 of FIG. 6 adds the vertical capacitance formed by the first and second coupled lines 440 and 450 besides the parallel capacitance formed by the first to third lines 410, 420, and 430, such that an overall coupling coefficient is increased.

Figure 7:
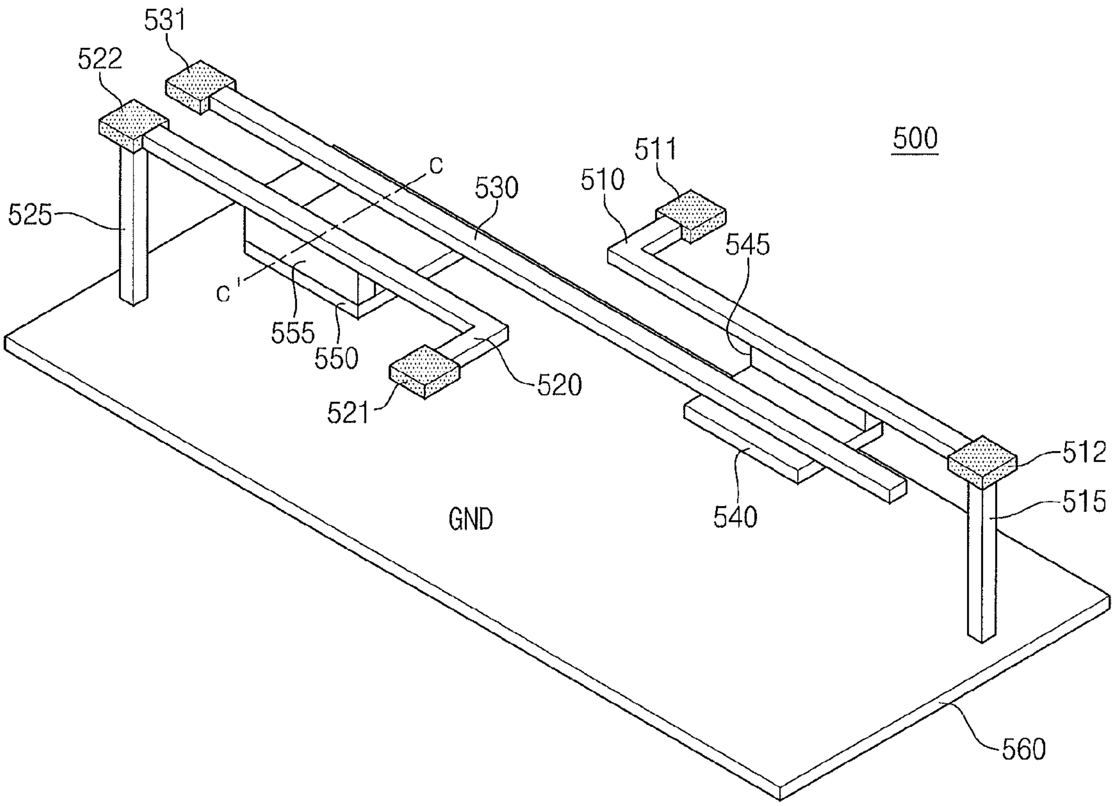
FIG. 7 is a view illustrating a marchand balun device according to a fifth embodiment of the present invention.

FIG. 7 is a view illustrating a marchand balun device according to a fifth embodiment of the present invention. The marchand balun device 500 includes first to third lines 510, 520, and 530 and first and second coupled lines 540 and 550.

The first line 510 is connected between a first balanced terminal 511 and a first ground terminal 512. The first ground terminal 512 is connected to a ground layer GND and 560 through a via 515. The second line 520 is connected between a second balanced terminal 521 and a second ground terminal 522. The second ground terminal 522 is connected to the ground layer GND and 560 through a via 525. The third line 530 is connected between the unbalanced terminal 531 and an open terminal.

The first line 510 is connected to the first coupled line 540 through a via 545. The length of the first coupled line 540 may be same as or less than that of the first line 510. The width of the first coupled line 540 may be the same as the sum of the width of the first line 510 and the width of the third line 530. The first coupled line 540 and the third line 530 form a vertical capacitance.

The second line 520 is connected to the second coupled line 550 through a via 555. The length of the second coupled line 550 may be same as or less than that of the second line 520. The width of the second coupled line 550 may be the same as the sum of the width of the second line 520 and the width of the third line 530. The second coupled line 550 and the third line 530 form a vertical capacitance.

The marchand balun device 500 of FIG. 7 is the same as that of FIG. 1 except that the via 545 is formed between the first line 510 and the first coupled line 540 and the via 555 is formed between the second line 520 and the second coupled line 550. However, like the marchand balun device 100 of FIG. 1, the marchand balun device 500 of FIG. 7 adds the vertical capacitance formed by the first and second coupled lines 540 and 550 besides the parallel capacitance formed by the first to third lines 510, 520, and 530, such that an overall coupling coefficient is increased.

Figure 8:
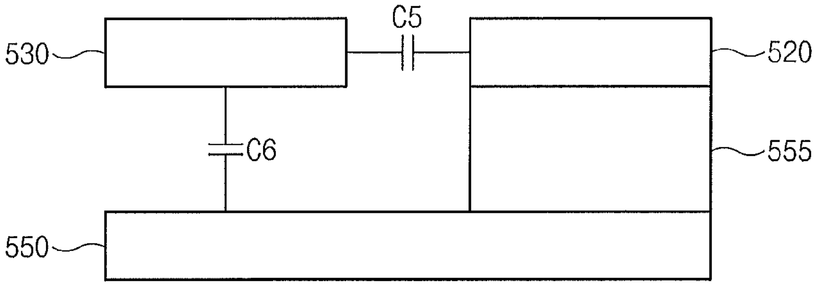
FIG. 8 is a cross-sectional view taken along the line c-c' of the marchand balun device 500 of FIG. 7.

FIG. 8 is a cross-sectional view taken along the line c-c' of the marchand balun device 500 of FIG. 7. Referring to FIG. 8, the marchand balun device 500 of FIG. 7 adds the vertical capacitance C6 between the second coupled line 550 and the third line 530 besides the parallel capacitance C5 between the second and third lines 520 and 530, such that an overall coupling coefficient is increased.

Figure 9:
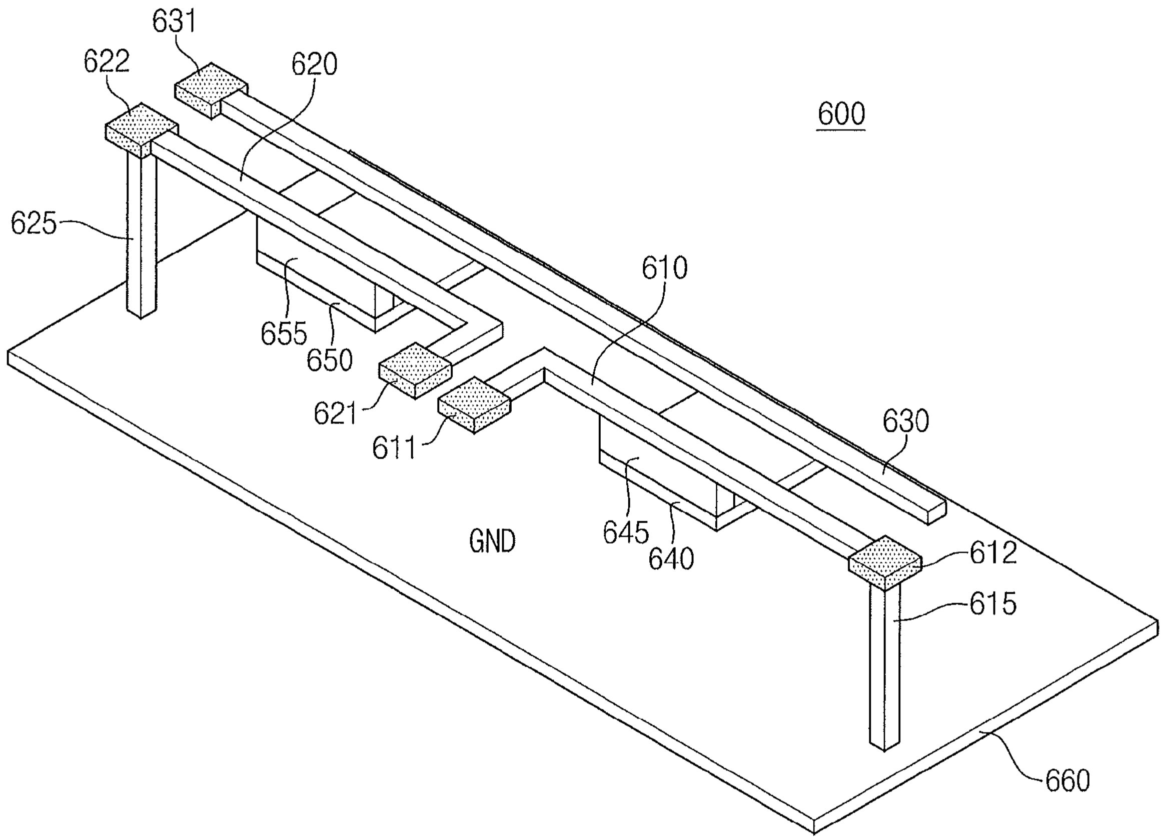
FIG. 9 is a view illustrating a marchand balun device according to a sixth embodiment of the present invention.

FIG. 9 is a view illustrating a marchand balun device according to a sixth embodiment of the present invention. The marchand balun device 600 includes first to third lines 610, 620, and 630 and first and second coupled lines 640 and 650.

The first line 610 is connected between a first balanced terminal 611 and a first ground terminal 612. The first ground terminal 612 is connected to a ground layer GND and 660 through a via 615. The second line 620 is connected between a second balanced terminal 621 and a second ground terminal 622. The second ground terminal 622 is connected to the ground layer GND and 660 through a via 625. The third line 630 is connected between an unbalanced terminal 631 and an open terminal.

The marchand balun device 600 of FIG. 9 is the same as that of FIG. 7 except that the first line 610 and the second line 620 are disposed in the same direction with respect to the third line 630. However, like the marchand balun device 500 of FIG. 7, the marchand balun device 600 of FIG. 9 adds the vertical capacitance formed by the first and second coupled lines 640 and 650 besides the parallel capacitance formed by the first to third lines 610, 620, and 630, such that an overall coupling coefficient is increased.

The marchand balun device according to the present invention may be realized with various kinds of embodiments besides the above mentioned embodiments according to a position of a via between a line and a coupled line.

Hereinafter, in order to describe operating characteristics of the marchand balun device according to the embodiments of the present invention, electromagnetic (EM) simulation for various structures will be described. Structural simulation with respect to a marchand balun device having only a parallel capacitance and structural simulation with respect to a marchand balun device having parallel and vertical capacitances will be experimentally compared and described. Conditions for the structural simulation are as follows.

Substrate: GaAS (permittivity: about 12.9) with about 100 μm thickness

Figure 10:
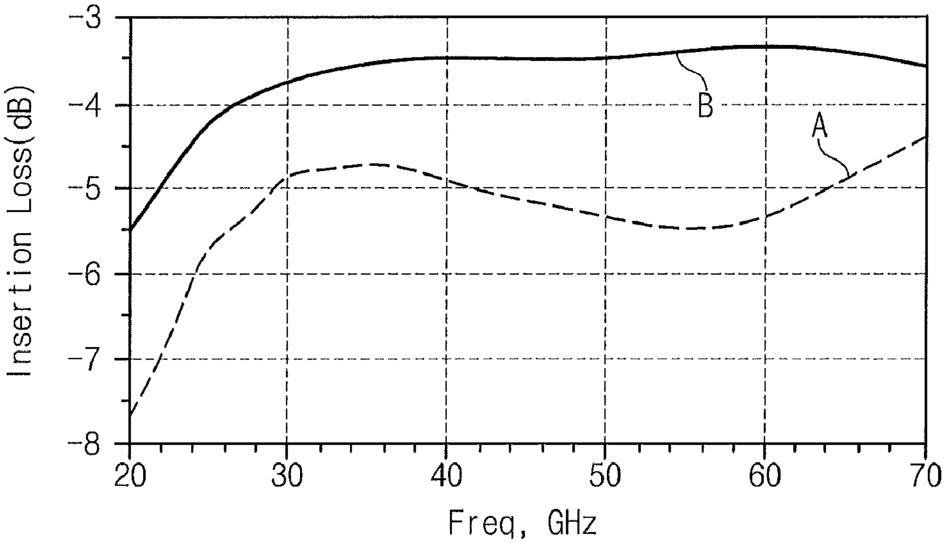
FIG. 10 is a graph illustrating an insertion loss simulation result of a marchand balun device according to an embodiment of the present invention.

Upper coupled line: about 2 μm thickness, about 20 μm width, about 4 μm interval between lines Lower coupled line: about 1 μm thickness, about 44 μm width, about 160 μm length Dielectric between vertical lines: about Polymide (permittivity: about 2.9) of about 1.6 μm thickness, SiN (permittivity: about 6.9) of about 0.1 μm thickness FIG. 10 is a graph illustrating an insertion loss simulation result of a marchand balun device according to an embodiment of the present invention. In FIG. 10, an x-axis represents a GHz frequency and a y-axis represents a dB ratio of an output signal amplitude in the balanced terminal 111 of FIG. 1 to an input signal amplitude in the unbalanced terminal 131 of FIG. 1.

Referring to FIG. 10, the dotted line A represents an insertion loss simulation result of a typical marchand balun device having only a parallel capacitance and the solid line B represents an insertion loss simulation result of the marchand balun of the present invention having parallel and vertical capacitances. The typical marchand balun device has an insertion loss property A of about 7.6 dB to about 4.5 dB in a frequency band of about 20 GHz to about 70 GHz. The marchand balun device of the present invention has an insertion loss property B of about 5.5 dB to about 3.4 dB in the same frequency band.

Figure 11:
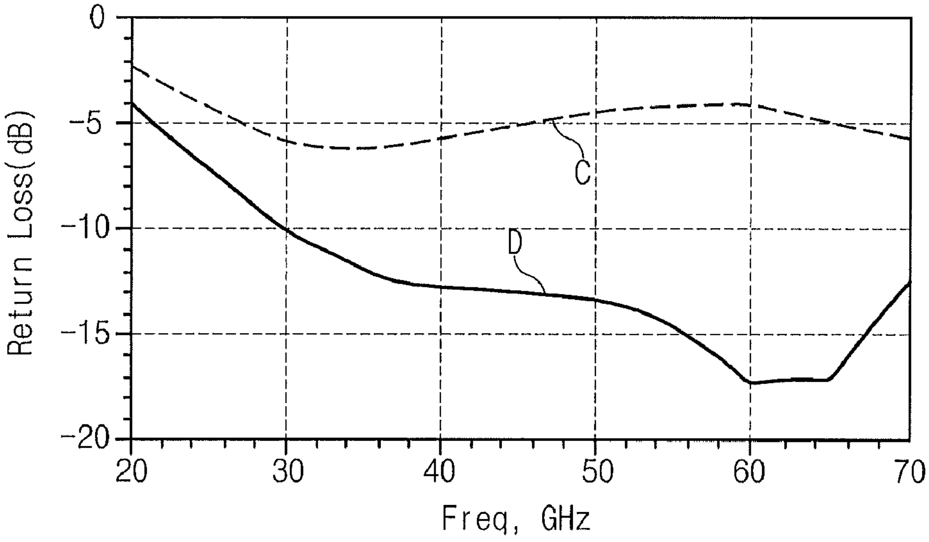
FIG. 11 is a graph illustrating a return loss simulation result of a marchand balun device according to an embodiment of the present invention.

FIG. 11 is a graph illustrating a return loss simulation result of a marchand balun device according to an embodiment of the present invention. In FIG. 11, an x-axis represents a GHz frequency and a y-axis represents a dB ratio of a return signal amplitude to an input signal amplitude in the unbalanced terminal 131 of FIG. 1.

Referring to FIG. 11, the dotted line C is a return loss simulation result of a typical marchand balun device having only a parallel capacitance and the solid line D is a return loss simulation result of the marchand balun device of the present invention having parallel and vertical capacitances. The typical marchand balun device a return loss property C of about −2 dB to about −6 dB in a frequency band of about 20 GHz to about 70 GHz. Since the marchand balun device of the present invention has a vertical structure added pattern, it has an improved return loss property D of about −4 dB to about −17 dB in the same frequency band.

Figure 12:
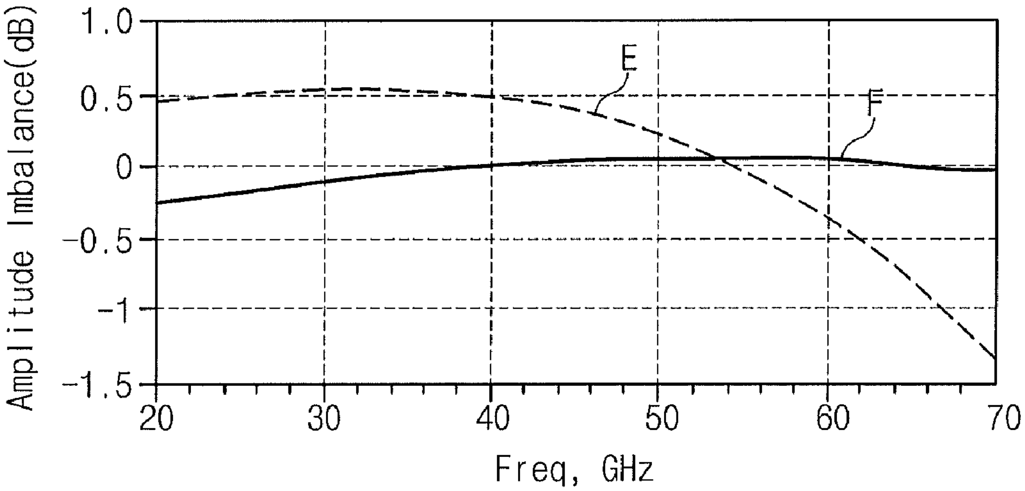
FIG. 12 is a graph illustrating an amplitude imbalance simulation result of a marchand balun device according to an embodiment of the present invention.

FIG. 12 is a graph illustrating an amplitude imbalance simulation result of a marchand balun device according to an embodiment of the present invention. In FIG. 12, an x-axis represents a GHz frequency and a y-axis represents a difference between a dB ratio of an output signal amplitude in the first balanced terminal 111 of FIG. 1 to an input signal amplitude in the unbalanced terminal 131 of FIG. 1 and a dB ratio of an output signal amplitude in the second balanced terminal 121 to an input signal amplitude in the unbalanced terminal 131.

Referring to FIG. 12, the dotted line E is an amplitude imbalance simulation result of a typical marchand balun device having only a parallel capacitance and the solid line F is an amplitude imbalance simulation result of the marchand balun device of the present invention having parallel and vertical capacitances. The typical marchand balun device an amplitude imbalance property E of about −1.3 dB to about −0.5 dB in a frequency band of about 20 GHz to about 70 GHz. On the contrary, since the marchand balun device of the present invention has a vertical structure added pattern, it has an improved amplitude imbalance property F of about −0.25 dB to about −0.1 dB in the same frequency band.

Figure 13:
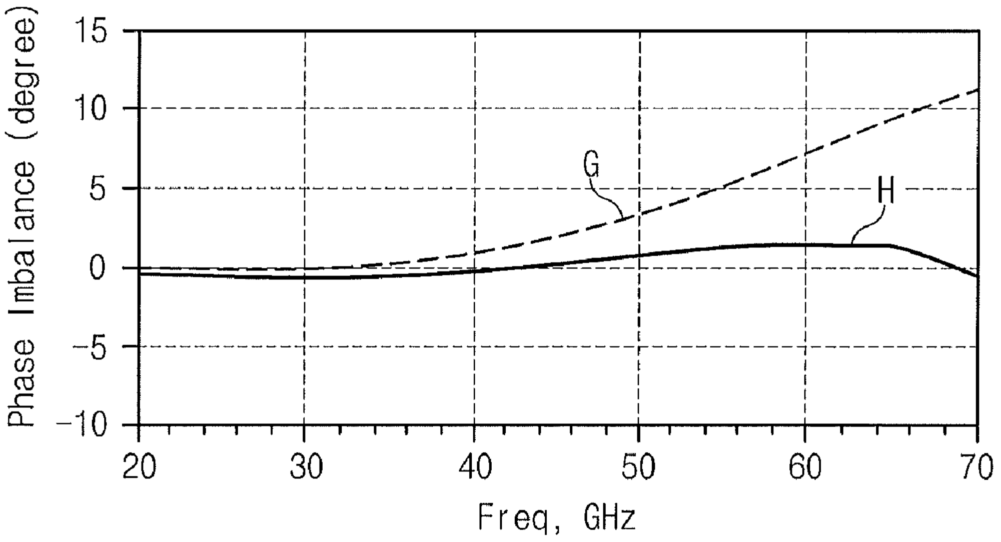
FIG. 13 is a graph illustrating a phase imbalance simulation result of a marchand balun device according to an embodiment of the present invention.

FIG. 13 is a graph illustrating a phase imbalance simulation result of a marchand balun device according to an embodiment of the present invention. In FIG. 13, an x-axis represents a GHz frequency and a y-axis represents how far a difference is deviated from about 180°. The difference is obtained by comparing a degree of an output signal phase in the first balanced terminal 111 of FIG. 1 with respect to an input signal phase in the unbalanced terminal 131 of FIG. 1 to a degree of an output signal amplitude in the second balanced terminal 121 of FIG. 1 with respect to an input signal phase in the unbalanced terminal 131.

Referring to FIG. 13, the dotted line G is a phase imbalance simulation result of a typical marchand balun device having only a parallel capacitance and the solid line H is a phase imbalance simulation result of the marchand balun device of the present invention having parallel and vertical capacitances. The typical marchand balun device has a phase imbalance property G of about 0° to about 11° in a frequency band of about 20 GHz to about 70 GHz. Since the marchand balun device of the present invention has a vertical structure added pattern, it has the improved amplitude imbalance property H of about 0° to about 1.5° in the same frequency band.

Referring to FIGS. 10 to 13, the typical marchand balun device may be used for a frequency band of about 30 GHz to about 60 GHz when considering the insertion loss, amplitude imbalance, and phase imbalance. Accordingly, the marchand balun device may operate in a bandwidth that is about two times the minimum frequency. The marchand balun device of the present invention may be seamlessly used in a frequency band of about 20 GHz to about 70 GHz and may have a broadband property corresponding to about 3.5 times the minimum frequency.

Furthermore, the marchand balun device of the present invention may be applied to an ultra wideband (UWB) technique. The UWB technique is the next generation wireless communication technique and is also called as a wireless digital pulse. The UWB technique uses a GHZ frequency and includes a low output pulse of thousands to millions per sec.

The UWB technique may transmit a large amount of data up to about 70 m at a low power consumption of about 0.5 mW, as penetrating ground or walls. Through the UWB technique, a high speed internet connection may be possible and a specific area may be monitored through a radar function. Moreover, a radar detection function may be utilized when a disaster such as earthquake occurs, in order to rescue people. Thus, its application range is extensive.

Furthermore, the marchand balun device of the present invention may be applied to the next generation open wireless communication signal processing technique such as Software Defined Radio (SDR). The SDR is a technique for using software for various operating parameters such as usage bands, modulation methods, and maximum outputs, which affect the frequency handling, without additional hardware changes. In such a way, the SDR increases the efficiency of limited frequency resources.

Moreover, the SDR is a technique that allows seamless global communication by downloading application software on an open structure single hardware platform in order to flexibly deal with various wireless connection environments. Thus, the SDR is considered as a solution for integrating wireless networks of the next generation communication system for wireless multimedia.

According to the present invention, besides a parallel capacitance, a vertical capacitance is included such that an overall coupling coefficient may be increased. A frequency operating bandwidth is increased and an operating property is improved by increasing a coupling coefficient.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A marchand balun device comprising:

a first line connected between a balanced terminal and a ground terminal;

a second line disposed horizontally parallel to the first line and forming a parallel capacitance jointly with the first line; and a coupled line disposed vertically parallel to the first and second lines and forming a vertical capacitance jointly with one of the first and second lines.

2. The marchand balun device of claim 1, wherein the second line is connected between an unbalanced terminal and an open terminal.

3. The marchand balun device of claim 2, wherein the coupled line is connected to one of the first and second lines through a via.

4. A marchand balun device comprising:

a first line connected between a first balanced terminal and a ground terminal;

a second line connected between a second balanced terminal and a ground terminal;

a third line disposed horizontally parallel to the first and second lines and forming a parallel capacitance jointly with the first and second lines;

a first coupled line disposed vertically parallel to the first and third lines and forming a vertical capacitance jointly with the first line or the third line; and a second coupled line disposed vertically parallel to the second and third lines and forming a vertical capacitance jointly with the second line or the third line.

5. The marchand balun device of claim 4, wherein the third line is connected to an unbalanced terminal and an open terminal.

6. The marchand balun of claim 5, wherein the third line is disposed between the first and second lines.

7. The marchand balun device of claim 5, wherein each of the first and second coupled lines are connected to the third line through a via.

8. The marchand balun device of claim 5, wherein the first coupled line is connected to the first line through a via and the second coupled line is connected to the second line through a via.

9. The marchand balun device of claim 5, wherein the lengths of the first and second lines are half of or less than that of the third line.

10. The marchand balun device of claim 5, wherein the lengths of the first and second coupled lines are the same as or less than those of the first and second lines.

* * * * *